United States Patent
Yamashita

(10) Patent No.: US 9,443,900 B2
(45) Date of Patent: Sep. 13, 2016

(54) PIXEL WITH MULTIGATE STRUCTURE FOR CHARGE STORAGE OR CHARGE TRANSFER

(71) Applicant: Taiwan Semiconductor Manufacturing Co., Ltd., Hsin-Chu (TW)

(72) Inventor: Yuichiro Yamashita, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/467,412

(22) Filed: Aug. 25, 2014

(65) Prior Publication Data
US 2016/0056201 A1    Feb. 25, 2016

(51) Int. Cl.
*H01L 27/146*    (2006.01)

(52) U.S. Cl.
CPC ..... *H01L 27/14654* (2013.01); *H01L 27/1464* (2013.01); *H01L 27/14603* (2013.01); *H01L 27/14609* (2013.01); *H01L 27/14612* (2013.01); *H01L 27/14616* (2013.01); *H01L 27/14689* (2013.01)

(58) Field of Classification Search
None
See application file for complete search history.

(56) References Cited

U.S. PATENT DOCUMENTS

| | | | | |
|---|---|---|---|---|
| 2008/0303095 A1* | 12/2008 | Xiong | | H01L 21/845 257/365 |
| 2015/0171133 A1* | 6/2015 | Kim | | H01L 27/14643 257/292 |

OTHER PUBLICATIONS

Vladimir Koifman, Chipworks Survey of Recent Image Sensor Pixel Structures, May 23, 2012, http://image-sensors-world.blogspot.com/2012/05/chipworks-survey-of-recent-image-sensor.html.

Cliff Smith, Digital Photography Tutorial: Camera Sensors, Feb. 2, 2007, p. 3, http://www.trustedreviews.com/opinions/digital-photography-tutorial-camera-sensors_Page-3.

* cited by examiner

*Primary Examiner* — Shaun Campbell
*Assistant Examiner* — Aneta Cieslewicz
(74) *Attorney, Agent, or Firm* — Eschweiler & Associates, LLC

(57) ABSTRACT

This disclosure provides an integrated circuit (IC) including one or more pixels. A photodiode is arranged in a semiconductor substrate and includes an n-type region near an upper surface of the substrate and a p-type region under the n-type region. A semiconductor fin is arranged over the photodiode and is electrically coupled to the n-type region of the photodiode. The semiconductor fin includes a transfer transistor and a separate charge storage or charge transfer region, wherein the charge storage or charge transfer region is adapted to store or transfer charge generated by the photodiode in response to impingent light.

20 Claims, 8 Drawing Sheets

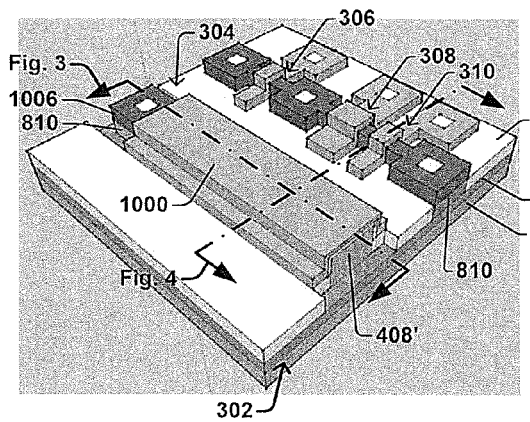
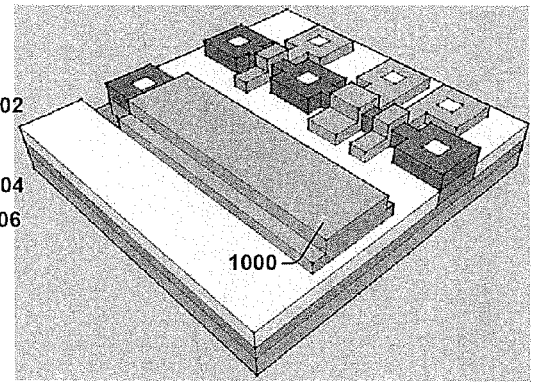
FIG. 2A  FIG. 2B
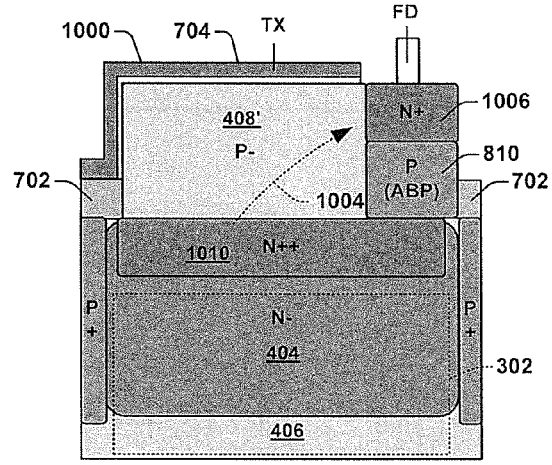
FIG. 3
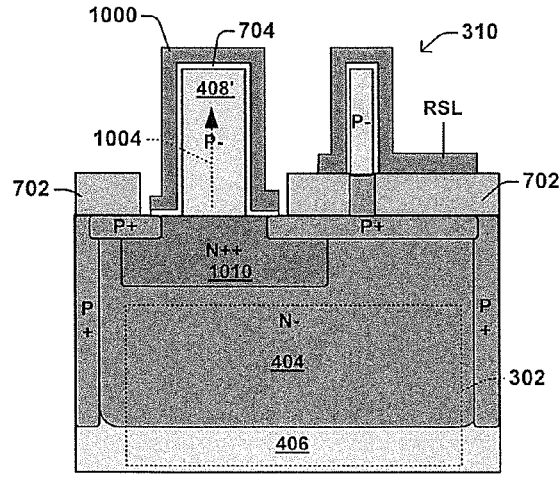
FIG. 4

PIXEL WITH MULTIGATE STRUCTURE FOR CHARGE STORAGE OR CHARGE TRANSFER

BACKGROUND

Digital cameras and optical imaging devices employ image sensors. Image sensors include an array of pixels, which are unit devices that convert an optical image into digital data. The pixels often manifest themselves as charge-coupled devices (CCDs) or complementary metal oxide semiconductor (CMOS) sensors, such as photodiodes. While CCDs are in some regards a more mature technology than CIS devices, CIS devices offer lower power consumption, smaller size, and faster data processing than CCDs as well as direct digital output that is not available in CCDs. Also, CIS devices have lower manufacturing costs than CCDs since CIS device can be manufactured using many standard semiconductor manufacturing processes. For these reasons, commercial employment of CIS devices has been steadily increasing in recent years.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B illustrates perspective views of a pixel arranged on a semiconductor substrate in accordance with some embodiments.

FIG. 3 illustrates a cross-sectional view of FIG. 2B's pixel as indicated by a cutaway line in FIG. 2A.

FIG. 4 illustrates a cross-sectional view of FIG. 2B's pixel as indicated by a cutaway line in FIG. 2A.

DETAILED DESCRIPTION

Figure 1:
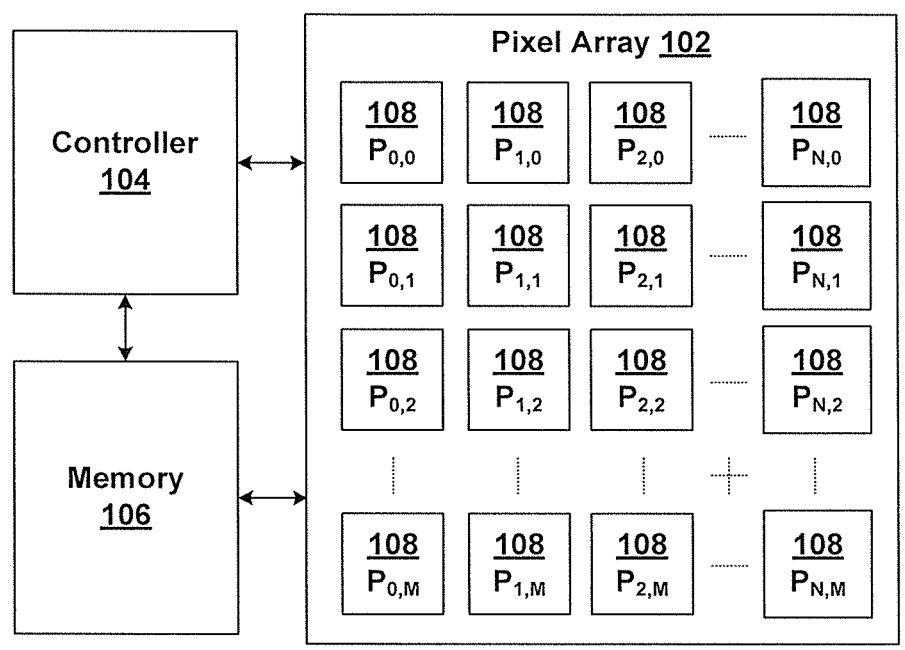
FIG. 1 illustrates a CIS device that includes an array of pixels in accordance with some embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Further, the term "multi-gate field-effect transistor" (MuGFET) as used in this application is contemplated as including a number of different structures where a gate electrode wraps at least partially or fully around a channel region of the transistor. Thus, the term MuGFET can include tri-gate FETs, gate-all-around FETs, pi-gate FETs, flex FETs, finFETs, and omega-gate FETs, among others.

Many portable electronic devices such as cameras, cellular telephones, personal digital assistants (PDAs), MP3 players, computers and other devices include an image sensor device for capturing images. One example of an image sensor device is a complementary metal-oxide semiconductor (CMOS) image sensor (CIS) device. As shown in FIG. 1, an image sensor device 100 includes a focal plane pixel array 102, a controller 104, and memory 106. The focal plane pixel array 102 typically includes individual pixels 108, which are arranged in a series of N rows and M columns, wherein M and N are positive integers. In FIG. 1's example, the individual pixels 108, which include respective photodiodes therein, have been labeled $P_{row}$, $P_{column}$ for clarity, and it will be appreciated that M and N can be equal or non-equal, depending on the implementation. Because the photodiodes within the pixel array 102 are naturally 'color blind', a color filter array (not shown) is typically arranged in front of the pixel array 102 to allow the pixel array 102 to assign color tones to each pixel.

During image capture operations, a camera shutter is opened to expose pixel array 102 to light (e.g., an optical image) and the individual pixels 108 each record light impingent at their respective array locations for some integration time. In some alternate cases, rows of photosensors are enabled without a mechanical shutter being used (so called "rolling shutter") or the entire array can be "flashed" on at once to record the image. Whatever the precise implementation, the light intensity measured for each pixel during this integration time thus forms image data, which can be color specific for each pixel if a filter is used. The image data is then transferred and stored in memory 106, and controller 104 subsequently gathers all the image data, and determines the light intensity recorded at each pixel to reconstruct a digital version of the image. In this way, images can be digitally recorded so device users can share the images on a computer, share them with friends, and the like.

Unfortunately, some CIS image sensors can suffer from a phenomenon known as "blooming". Blooming occurs when the amount of charge generated at a pixel exceeds the storage capacity (FWC-full well capacity) of the pixel and excess charge overflows into neighboring pixels. For example, in FIG. 1, if pixel $P_{1,1}$ was struck with a high-intensity light that over-saturated the storage capacity of pixel $P_{1,1}$; excess charge could leak out through the substrate to neighboring pixels (e.g., $P_{1,0}$, $P_{0,1}$, $P_{2,1}$, or $P_{1,2}$), causing these pixels to report misleadingly high light levels. Blooming may occur if the integration period is too long or the light incident on the pixel is too bright. This excess or overflow charge is indistinguishable from the charge that would be generated in the neighboring photodiodes if those photodiodes had been subjected to light. Hence, the neighboring photodiodes appear to be irradiated with more light than actually impingent thereon due to the excess or overflow charge. Accordingly, a small, high-intensity, light irradiation pattern at one or more pixels appears to "bloom" into a much larger pattern over neighboring pixels as well.

To limit blooming while still generating a sufficiently large number of carriers on the photodiode (hereafter FWC: Full Well Capacity), it is desirable for each pixel to be capable of storing a large amount of charge and/or to be capable of transferring charge from the photodiode in an efficient manner. One way to increase the amount of charge storage is by increasing the footprint of the pixels, because larger pixels tend to be able to better store larger amounts of charge without blooming. However, although larger pixels tend to be able to store more charge without "blooming", a pixel array made up of larger pixels tends to provide lower resolution images than a pixel array made up of smaller pixels. Therefore, there is a tradeoff between larger pixels, which tend to be more robust against blooming but also tend to provide lower resolution images; and smaller pixels, which tend to provide higher resolution images but which also tend to be more susceptible to blooming.

To improve the performance of pixels, the present disclosure makes use of fin-like structures in the context of pixels. In particular, the use of fin-like structures, such as MuGFETs, allows photodiodes to extend under transfer transistors and other transistors within the pixel, while conventional structures put photodiodes and transfer transistors on non-overlapping areas within the pixel. Thus, some pixels of the current disclosure exhibit less "dead space" under transfer transistors or other transistors within the pixel, which improves light detection ability of the pixel without sacrificing area or resolution. Further, the vertical nature of the fin-like structures allows the corresponding pixel to store a relatively large amount of charge in a relatively small footprint on the substrate, and thus provides a good tradeoff between resolution and blooming resistance.

FIGS. 2A-B, FIG. 3, and FIG. 4 collectively illustrate an embodiment of a pixel, which includes a photodiode 302, access transistor 304, reset transistor 306, source-follower (SF) transistor 308, and row select transistor 310 in accordance with some embodiments. Notably the photodiode 302 includes a p-n junction which is defined at a junction interface between N− region 404 and p− region 406 and which extends under the transfer transistor 304, reset transistor 306, SF transistor 308, and row-select transistor 310. Notably, because the photodiode 302 extends under the fin 408' as well as under the pixel transistors 304-310 (or in other words because the fin 408' and transistors 304-310 overlap the photodiode 302), the pixel of FIGS. 2A-2B can provide more photocurrent than other solutions where the photodiodes and transfer transistors are in non-overlapping or mutually exclusive areas within the pixel.

Fin 408' acts as a charge transport region based on whether a sufficient voltage bias is applied to a gate electrode 1000 overlying the fin 408'. In other words, in this example, charge generated by the photodiode 302 in response to impingent light remains stored in a bulk n+ region (404 or 1010). P-type fin 408' and p-type anti-blooming path 810, as well as dielectric 702, prevent or limit charge from drifting or diffusing upward into the fin 408'. When a sufficient gate-source voltage is applied, however, the charged stored in the bulk n+ region (1010 or 404) is transferred up through the p− fin 408' (see arrows 1004) to the N+ region 1006 which can act as a floating diffusion (FD) node. An optional N++ doped region 1010 can also be present near upper portion of N− region 404 to help increase carrier concentration and enhance charge transfer. Although FIG. 2A shows an example where an end of the fin 408' opposite the access transistor 304 is exposed, note that the gate electrode 1000 can also cover the end of the fin 408', as shown in FIG. 2B. Further, in some embodiments of FIG. 2A-2B the region 810 may be referred to as a p-type isolation region or an anti-blooming path.

Figure 5:
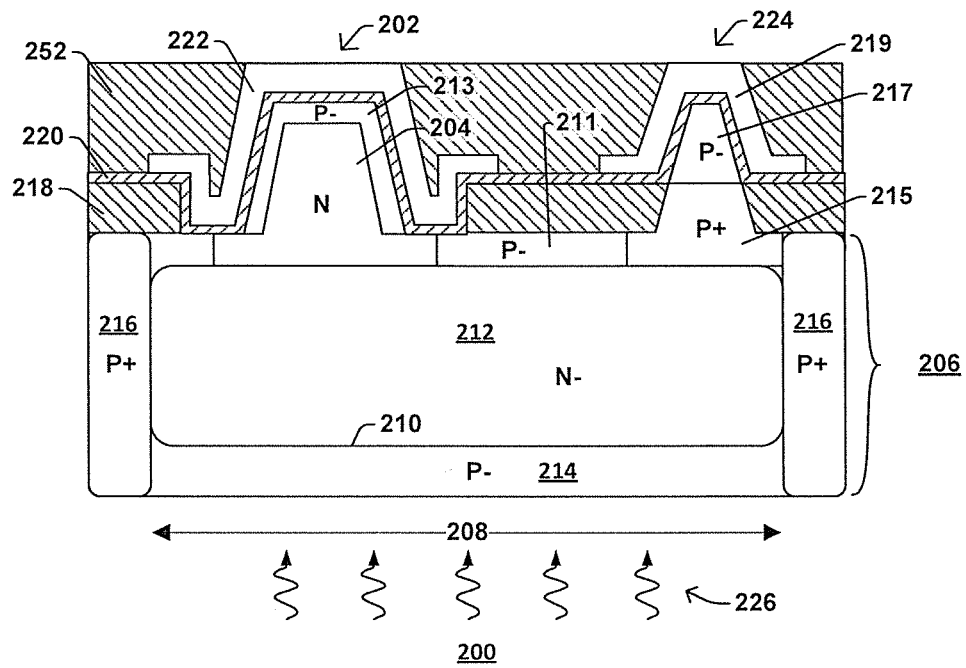
FIG. 5 illustrates a cross-sectional view of a portion of a pixel which includes one or more semiconductor fins, where charge is stored in a charge storage region of a semiconductor fin in accordance with some embodiments.

FIG. 5 shows a cross-sectional view of part of an image sensor pixel 200 which includes a semiconductor fin 202 with a charge storage region 204 in accordance with some embodiments. The image sensor pixel 200 is arranged on a semiconductor substrate 206, and includes an active region 208 that is circumscribed by isolation structure 216. The isolation structure 216 extends downward around the active area 208 to circumscribe individual pixels and to electrically isolate neighboring pixels from one another. In the illustrated embodiment, the isolation structure 216 manifests as a doped region implanted into the semiconductor substrate 206 to limit charge flow between pixels, but in other embodiments the isolation structure 216 can include dielectric regions buried in the semiconductor substrate 206.

Within the active region 208, a p-n junction 210 corresponding to a photodiode is defined at an interface between n-type region 212 and p-type region 214. During operation when impingent light 226 reaches the N− region 212, for example from the back side of the substrate 206, electron-hole recombination occurs in the photodiode, causing charge carriers to build up in the N− region (cathode) 212 according to the intensity of light received.

In embodiments where the charge storage region 204 is adapted to store charge, the region 204 is doped n-type and abuts the n-type region 212. Hence, due to the repulsion of like-charged particles to one another and the presence of one or more optional p-type regions, such as p− region 211, charge stored on N− region 212 will tend to diffuse or drift onto n-type charge storage region 204 within fin 202. A gate dielectric 220 arranged over an outer surface of fin 202 can provide a sufficiently large barrier to limit or prevent stored charge from leaking outward through fin sidewalls or upward through fin upper surface. A conductive electrode layer 222 can also be present over the fin's charge storage region 204. Again, the vertical nature of the fin 202 and its charge storage region 204 allows the corresponding pixel 200 to store a relatively large amount of charge in a relatively small footprint on the substrate 206, and is thus in some regards more efficient than other approaches.

In some embodiments, the electrode 222 is biased to the voltage during the integration period such that the opposite carrier to the photocarrier is accumulated at the interface of the silicon and the gate dielectric 220 in order to reduce the effect of the unwanted carrier generation which is called dark current or white pixel. In the illustrated embodiment, holes are to be accumulated to recombine with unwanted electrons generated at the interface of the silicon and gate dielectric 220. A p− region 213 near the upper surface and sidewalls of fin can help to further reduce this dark current or white pixel effect. Although region 213 is advantageous in some regards to reduce dark current, it is not necessary and in other embodiments fin 202 can be entirely n-type.

For illustration, FIG. 5 also shows a FinFET 224 arranged on the substrate 206. The FinFET 224 includes a p− channel region 217 under a conductive gate electrode 219, and a p+ isolation region 215 to isolate the FinFET 224 from the n-type region 212 of the photodiode. This FinFET 224 can be one of several different transistors in the pixel, including a transfer transistor, reset transistor, source-follower transistor, or row select transistor, for example.

Figure 6:
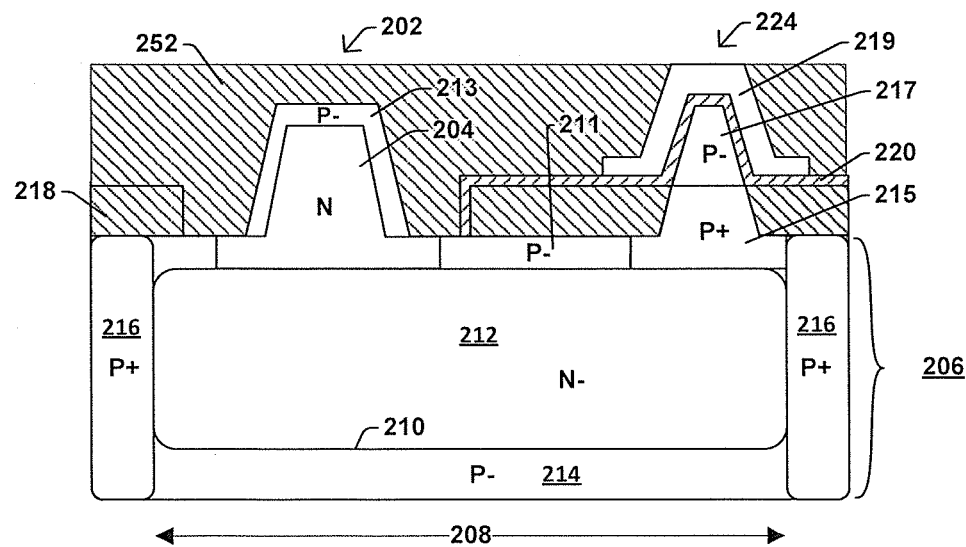
FIG. 6 illustrates a cross-sectional view of a portion of another pixel which includes one or more semiconductor fins, where charge is stored in a charge storage region of a semiconductor fin in accordance with some embodiments.

FIG. 6 shows another embodiment similar to FIG. 5, but where optional gate electrode (e.g., 222 in FIG. 5) has been removed. The dielectric 252, such as an interlayer dielectric of SiO2 or a low-k dielectric layer, directly abuts the p− region 213 of the fin 202 in this example.

Figure 7:
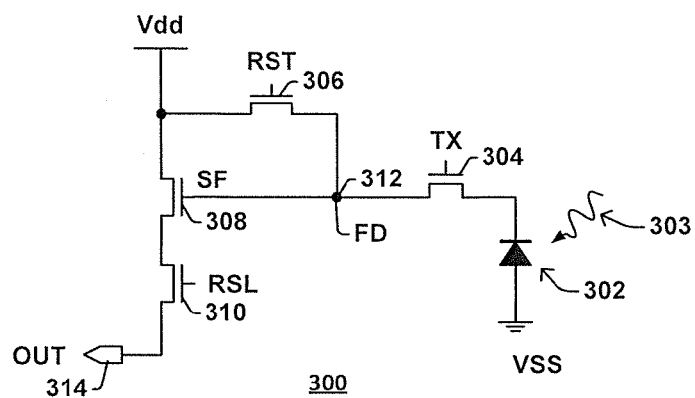
FIG. 7 illustrates a schematic view of pixel in accordance with some embodiments.

FIG. 7 illustrates a more detailed schematic of a pixel 300 in accordance with some embodiments. Although FIG. 7 illustrates only a single pixel 300, it will be appreciated that image sensor devices in accordance with this disclosure commonly include an array of such pixels, such as previously described with regard to FIG. 1. The pixel 300 includes a photo-detecting element 302, such as a photodiode, to detect the presence and/or intensity of polychromatic or monochromatic incident light 303. The pixel 300 also includes a transfer transistor 304, a reset transistor 306, a source-follower transistor 308, and a row select transistor 310. A floating diffusion region (FD) 312 is arranged between the transfer transistor 304 and reset transistor 306, being at a gate of the source-follower transistor 308. The source-follower transistor 308 and row select transistor 310 are in series and help determine an output signal, such as an amount of charge, delivered to the output node of the pixel (OUT) 314.

During operation of pixel 300, a shutter opens to expose the individual pixels to light (e.g., an optical image) or one or more rows of photosensors are enabled without a mechanical shutter (so called "rolling shutter"). At a predetermined time (e.g., before the shutter opens or after the shutter opens but before integration for a pixel beings), the RST signal is pulsed high to couple the FD node 312 to a DC supply voltage (e.g., VDD or another pre-charge voltage) to pre-charge the FD node, thereby preparing for the pixel 300 to measure the charge delivered by photodiode 302. The RST signal is then de-asserted, causing any impingent light to generate charge carriers whose levels build up in the cathode of the photodiode 302 according to the intensity of light received. In some embodiments of the present application, these charge carriers from the photodiode 302 accumulate in a charge storage region of a semiconductor fin, which provides a good balance between small footprint and large charge storage capability. While the RSL signal is asserted, the TX signal is then pulsed high for some integration time, causing charge pent up in charge storage region of fin and generated by photodiode 302 to pass through the transfer transistor 304 to the FD node 312. This charge may be referred to as an integrated photo-measurement signal. As the FD node 312 accumulates electrons, its voltage is pulled down, thereby tending to turn off the source/follower transistor 308, and reducing current flow out of the pixel output 314. After the TX signal is asserted, the change in current at the output 314 due to assertion of TX, which is often integrated, is measured to determine the intensity of light detected by the pixel 300. Because different rows of a pixel array can have different row select signals (e.g., row 1 can be controlled by RSL1, row 2 can be controlled by RSL2, and so on); images can be captured by "rolling" shutter techniques in some embodiments, wherein different rows of the pixel array record imagery information in consecutive time intervals. Advantageously, the use of a fin for charge storage node of photodiode 302 helps limit risk of blooming while also promoting high resolution images.

Figure 8:
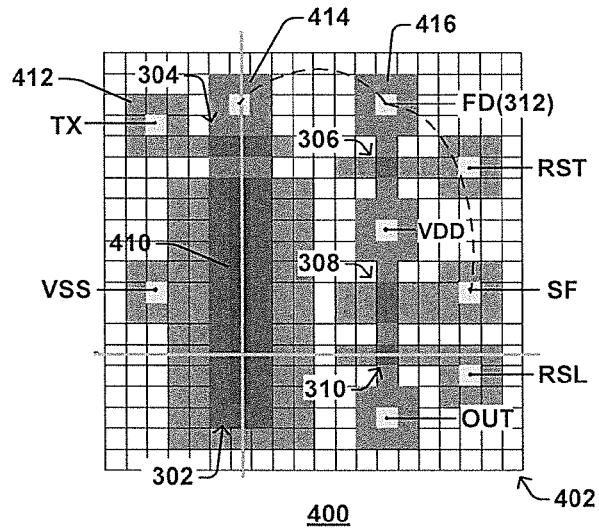
FIG. 8 illustrates a top (layout) view of a pixel in accordance with some embodiments consistent with FIG. 7.
Figure 9:
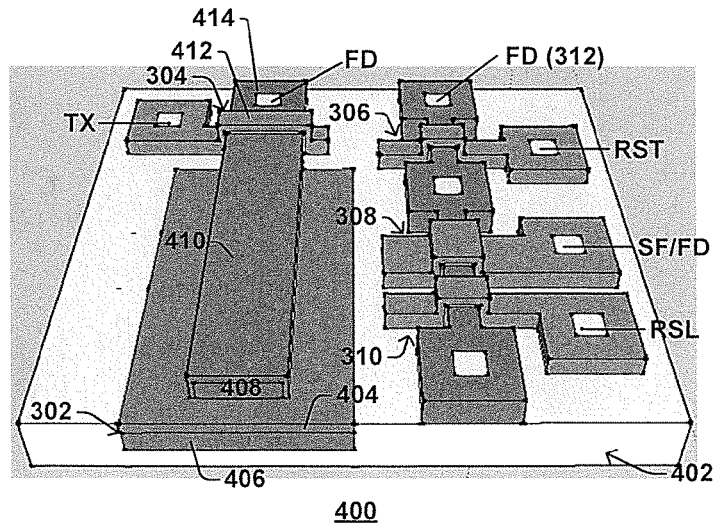
FIG. 9 illustrates a perspective view of a pixel arranged on a semiconductor substrate in accordance with some embodiments consistent with FIG. 7.
Figure 10:
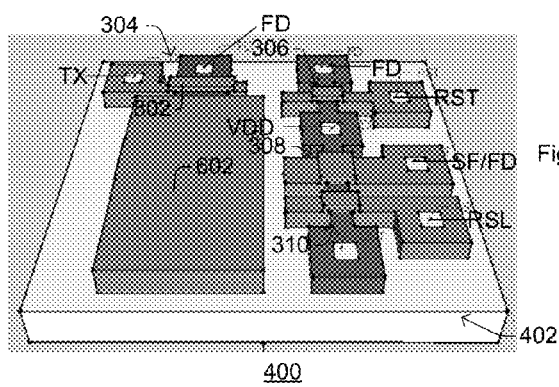
FIG. 10 illustrates a perspective view of another example of a pixel arranged on a semiconductor substrate in accordance with some embodiments.

FIGS. 8-13 illustrate examples of pixels where charge is stored in a charge storage region of a fin, thereby allowing the pixel to store more charge in a smaller footprint. FIG. 8 illustrates an example of a top layout view of a pixel 400 consistent with FIG. 7's schematic 300, and FIG. 9 shows a three-dimensional perspective view of FIG. 8's pixel 400 which clearly illustrates an example of a fin 408 with a charge storage region. Pixel 400, which is arranged on substrate 402, is now described with regards to FIGS. 8 and 9 concurrently. In some embodiments, the substrate 402 is a bulk silicon substrate, but in other embodiments the substrate 402 is a silicon-on-insulator (SOI) substrate. If present, an SOI substrate can include a handle substrate region, such as a bulk silicon substrate or a III-V substrate; an oxide layer over the handle substrate region; and a silicon device region of high-quality silicon over the oxide layer and in which semiconductor fins are arranged.

Pixel 400 includes a photodiode 302, a transfer transistor 304, a reset transistor 306, a source-follower transistor 308, and a row select transistor 310. A floating diffusion (FD) node 312 is arranged between the transfer transistor 304 and reset transistor 306, being at a gate of the source-follower transistor 308. The source-follower transistor 308 and row select transistor 310 help deliver an output signal (OUT) to the pixel output node 314.

A p-n junction corresponding to photodiode 302 is defined at an interface between n-type region 404 and p-type region 406. During operation when impingent light strikes the p-n junction, for example from the back side of the substrate 402, electron-hole recombination occurs in the photodiode 302, causing charge carriers to build up in the N− region (cathode) 404 and in the N-type semiconductor fin 408, according to the intensity of light received.

Notably, the semiconductor fin 408 is arranged over the photodiode 302 and is electrically coupled to the photodiode's n-type region 404. In the example of FIGS. 8-9, the semiconductor fin 408 includes a transfer transistor 304 and a separate charge storage region 410. A p-type channel region or intrinsic channel region, which resides along the length of the fin and is straddled by the transfer transistor gate electrode 412, separates a first source/drain region 414 of the transfer transistor from the charge storage region 410. Thus, a second source/drain region of the transfer transistor is shorted to or otherwise corresponds to the fin charge storage region 410.

Further, the reset transistor 306, source-follower transistor 308, and row select line transistor 310 each have gate electrodes that straddle a single fin 416 that extends in a continuous linear fashion between the FD node and an output node of the pixel. This layout promotes a dense pixel array.

FIG. 9 shows another example of FIG. 8's pixel 400, but without a conductive electrode 602 (see FIG. 10, 602), such as a (polysilicon or) metal electrode, in place over the fin. Instead, in some embodiments, the very surface of the silicon fin 408 can be doped to P-type, to avoid the generation of the dark current.

Figure 11:
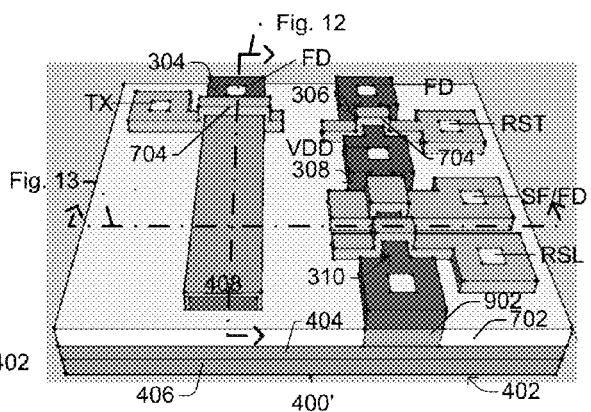
FIG. 11 illustrates a perspective view of another example of a pixel arranged on a semiconductor substrate in accordance with some embodiments.

FIG. 11 shows another example of a pixel 400' where isolation dielectric layer 702 is arranged over the substrate 402. The isolation dielectric layer 702 is an isolating dielectric and is thicker than a gate dielectric layer 704, which separates gate electrodes from fin channel regions. The isolation dielectric layer 702 separates the upper surface of the substrate 402 from lower surfaces of gate electrodes of the reset transistor 306, source-follower transistor 308, and row select transistor 310.

Figure 12:
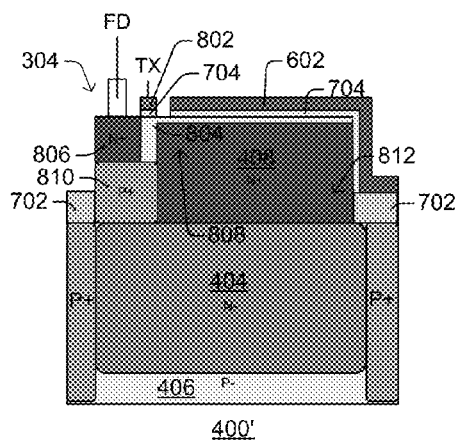
FIG. 12 illustrates a cross-sectional view of FIG. 11's pixel as indicated by a cutaway line in FIG. 7.

FIG. 12 shows a cross-sectional view of FIG. 11's pixel 400' as indicated FIG. 11. As shown in FIG. 12, the N+fin region 408 extends at least partially over p-n junction of photodiode defined by n-type region 404 and p-type region 406. The transfer transistor gate 802 overlies a transfer transistor channel region 804 in the substrate. The transfer transistor channel region 804 separates a first source/drain region 806 (which corresponds to FD node) from a second source/drain region 808 (which corresponds to the charge storage region in fin 408). A P-type anti-blooming path region 810 may also be present in some embodiments to help limit risk of blooming from the FD node. In FIG. 12's embodiment, the charge storage region of the fin 408 extends downward into a recessed portion 812 of the isolating dielectric layer 702.

Figure 13:
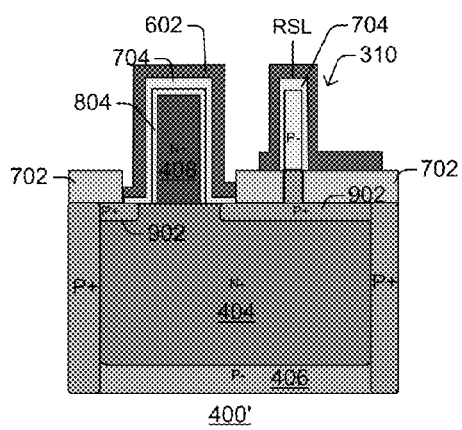
FIG. 13 illustrates a cross-sectional view of FIG. 11's pixel as indicated by a cutaway line in FIG. 11.

FIG. 13 shows a cross-sectional view of FIG. 11's pixel 400' as indicated in FIG. 11. As shown in FIG. 13, the N+fin region 408 extends at least partially over n-type region 404 and p-type region 406. Shallow p+regions 902 electrically isolate the photodiode n+region 404 from other finFETs (e.g., RSL transistor 310).

Figure 14:
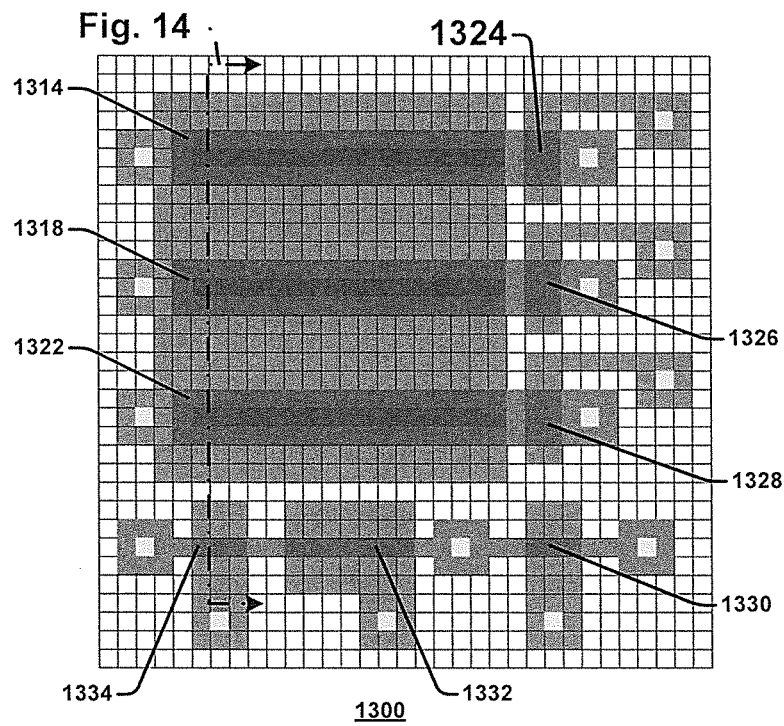
FIG. 14 illustrates a top view of a pixel that includes different monochromatic detection layers stacked over one another.
Figure 15:
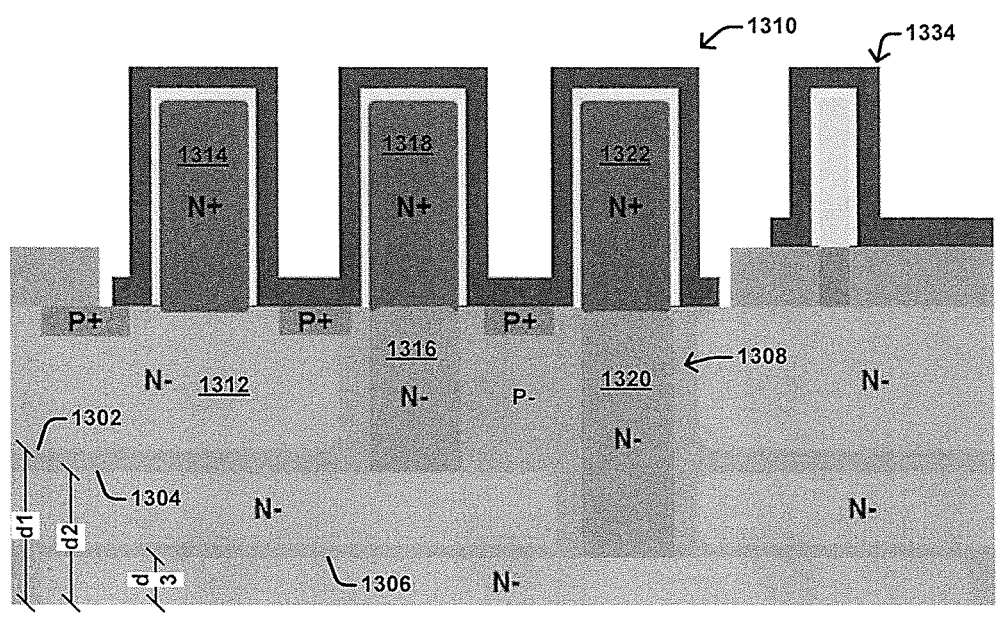
FIG. 15 illustrates a cross-sectional view of FIG. 14's pixel along the cross-sectional line shown in FIG. 14.

FIG. 14 and FIG. 15 collectively depict another pixel 1300 that includes different monochromatic detection layers stacked over one another in accordance with some embodiments. FIG. 14 shows a top layout view of pixel 1300, and FIG. 15 illustrates a cross-sectional view of FIG. 14's pixel along the cross-sectional line shown in FIG. 14. This pixel 1300 includes different photodiodes arranged at different depths from backside of substrate, wherein the different depths correspond to different monochromatic wavelengths to be detected by the various photodiodes. For example, in the illustrated embodiment, a first photodiode junction 1302 is arranged at a first depth, $d_1$, which facilitates detection of red light; a second photodiode junction 1304 is arranged at a second depth, $d_2$, which facilitates detection of green light; and a third photodiode junction 1306 is arranged at a third depth, $d_3$, which facilitates detection of blue light. Columnar N– doped regions 1308 are arranged in the substrate to couple the various photodiode junctions to the corresponding fins 1310 on which generated charge is stored. For example, first photodiode junction 1302 has its n-type region 1312 coupled to a first fin 1314; a first columnar N– doped region 1316 extends upward from the second photodiode junction 1304 to a second fin 1318; and a third columnar N– doped region 1320 extends upward from the third photodiode junction to a third fin 1322. The first, second, and third fins can be coupled to first, second, and third access transistors 1324, 1326, 1328, respectively. Reset transistor 1330, source follower transistor 1332, and row select transistor 1334 can also be present and can be shared between the access transistors 1324-1328 in some embodiments.

Figure 16:
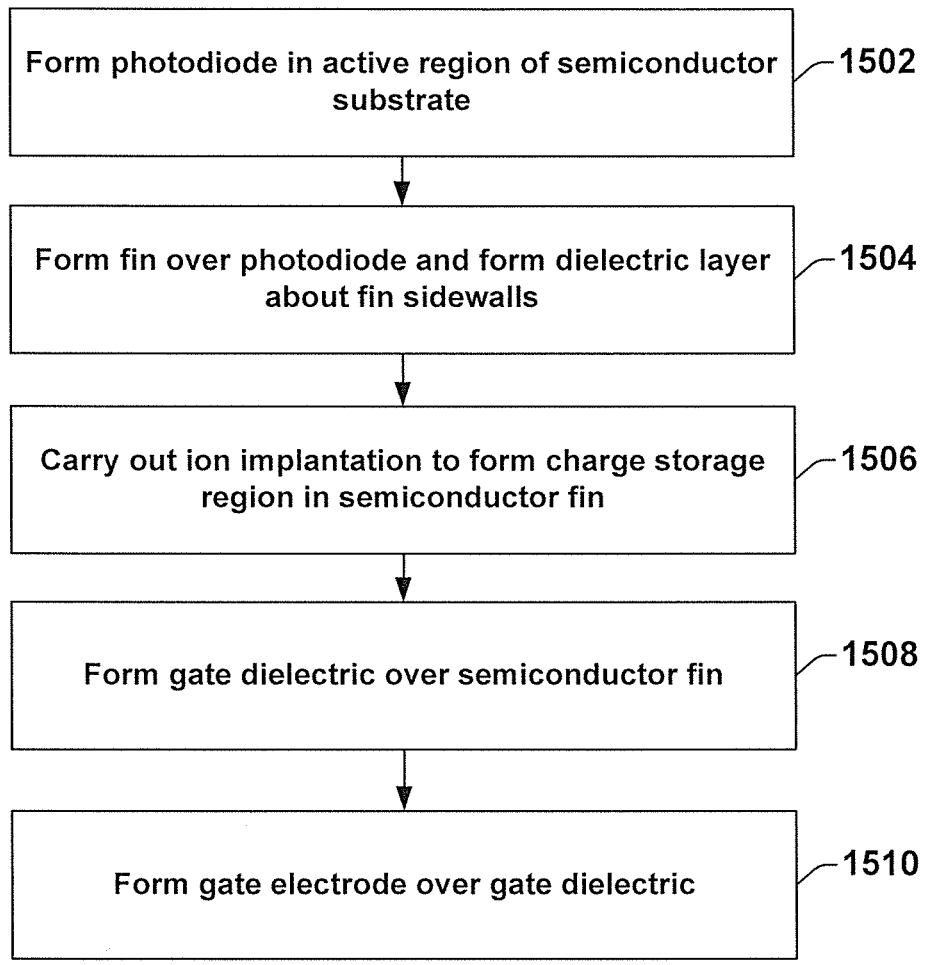
FIG. 16 shows a flowchart illustrating a method of manufacturing a pixel in accordance with some embodiments.

FIG. 16 shows a flowchart illustrating a method for manufacturing a pixel in accordance with some embodiments. While the disclosed methods (e.g., the method described by the flowchart 1500, as well as cross-sectional views in FIGS. 17-21) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 1502, a photodiode is formed in an active region of a bulk semiconductor substrate. Alternatively, a photodiode could be formed in a handle wafer region of an silicon-on-insulator substrate.

At 1504, a fin is formed over the photodiode. In embodiments where the photodiode is formed in the bulk substrate, formation of the fin can include etching recesses in the substrate where un-recessed regions correspond to fins. A dielectric can then be formed over the sidewalls of the fins. In other embodiments where the photodiode is formed in a handle wafer region an SOI substrate, the fins can be formed by recessing regions of the silicon device layer and underlying dielectric layer, and then epitaxially growing fins in those recesses.

At 1506, an ion implantation operation is carried out to form a charge storage region in the semiconductor fin. In some alternate embodiments, doping can be achieved by out-diffusion of dopants from deposited layers, or can be achieved by epitaxial growth of n-type or p-type material for the fins.

At 1508, a gate dielectric is formed over semiconductor fin. In some embodiments, the gate dielectric is silicon dioxide, but in other embodiments, the gate dielectric is a high-k dielectric.

At 1510, a gate electrode is formed over the gate dielectric. In some embodiments, the gate electrode is a metal, such as copper, aluminum, tungsten, nickel, and/or alloys thereof; but in other embodiments the gate electrode is doped polysilicon.

FIGS. 17-21 show a series of cross-sectional views that collectively depict a method of manufacturing a pixel in accordance with some embodiments. For purposes of clarity, the cross-sectional views are described below with regards to FIG. 16's method. However, it will be appreciated that the cross-sectional views of FIGS. 17-21 in no way limit the method of FIG. 16, in that FIG. 16's methodology can be implemented with any number of device structures. Further, it will be appreciated that the method of FIG. 16 does not limit how the cross-sectional views are made, in that the various cross-sectional views may be made by a number of different processes, which are not necessarily limited to FIG. 16.

Figure 17:
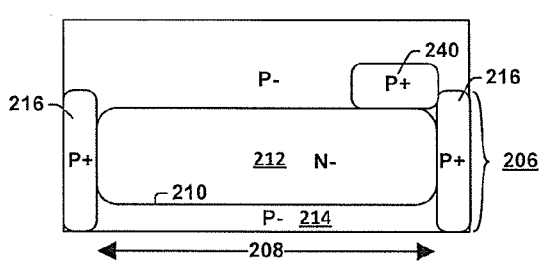
FIGS. 17-21 illustrate a method of manufacturing a pixel in accordance with some embodiments.

In FIG. 17, a photodiode 210 is formed in an active region 208 of a bulk semiconductor substrate 206. The photodiode 210 is defined between an N− region 212 and a P− region 214, and may be circumscribed by isolation structure 216, which may manifest as P+ doped regions. An anti-blooming path region 240, which is doped P+ may also be present.

Figure 18:
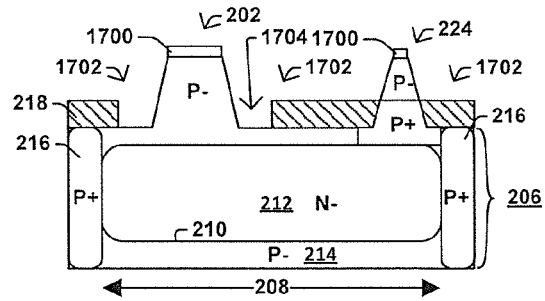

In FIG. 18, one or more fins 202, 224 is formed over the photodiode. To form the illustrated fins 202, 224, a mask 1700 is formed, and an etch is carried out with the mask 1700 in place to form recesses 1702 in the substrate. Un-recessed regions covered by the mask 1700 correspond to the fins 202, 224. A dielectric 218, such as silicon dioxide, can then be formed over the sidewalls of the fins, and can optionally be etched away to form a recess 1704 adjacent to a charge storage region of the fin.

Figure 19:
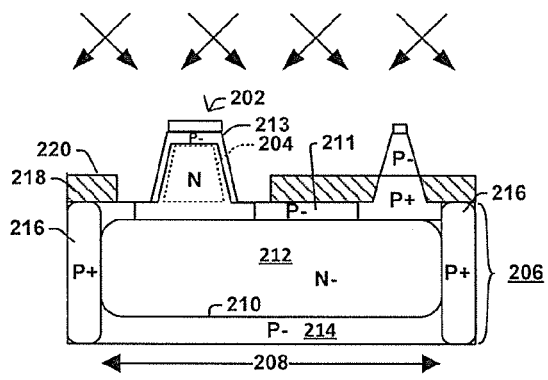

In FIG. 19, an ion implantation operation 1800 is carried out to form a charge storage region 204 in the semiconductor fin. In the illustrated embodiment, the ion implantation operation uses an angled (i.e., non-normal) implant and forms an N type charge storage region 204 beneath an outermost surface of the fin 202. Thus, in some embodiments, a p− region 213 can remain at the outermost surface of the fin to help prevent charge leakage which can lead to blooming or other noise problems.

Figure 20:
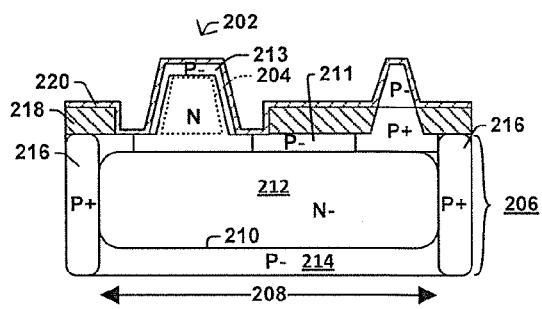

In FIG. 20, a gate dielectric 220 is formed over semiconductor fin. In some embodiments, the gate dielectric 220 is silicon dioxide, but in other embodiments, the gate dielectric 220 is a high-k dielectric.

Figure 21:
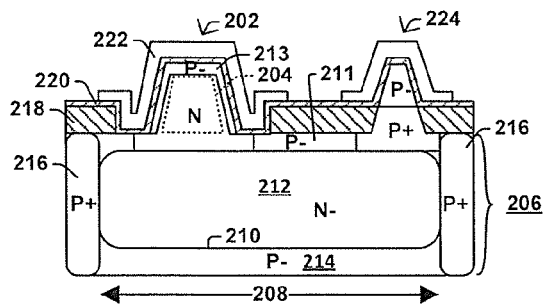

In FIG. 21, a gate electrode 222 is formed over the gate dielectric 220. In some embodiments, the gate electrode 22 is a metal, such as copper, aluminum, tungsten, nickel, and/or alloys thereof; but in other embodiments the gate electrode is doped polysilicon.

Therefore, some embodiments relate to an integrated circuit (IC) including one or more pixels. A photodiode is arranged in a semiconductor substrate and includes an n-type region near an upper surface of the substrate and a p-type region under the n-type region. A semiconductor fin is arranged over the photodiode and is electrically coupled to the n-type region of the photodiode. The semiconductor fin includes a transfer transistor and a separate charge storage or charge transfer region, wherein the charge storage or charge transfer region is adapted to store or transfer charge generated by the photodiode in response to impingent light.

Other embodiments relate to an integrated circuit (IC) including a plurality of pixels arranged in a pixel array, wherein a pixel comprises: a photodiode arranged in a substrate and including an n-type region near a upper surface of the substrate and a p-type region under the n-type region; a transfer transistor corresponding to a semiconductor fin and having a source/drain region coupled to the n-type region of the photodiode, and configured to selectively transfer charge from the n-type region of the photodiode to a floating diffusion (FD) node, wherein a voltage level of the FD region controls a read-out circuit of the pixel; and a charge storage region arranged in the semiconductor fin, wherein the charge storage region is adapted to store charge generated by the photodiode in response to impingent light.

Still other embodiments relate to a method of forming a pixel. In this method, a photodiode is formed in an active region of a bulk semiconductor substrate. A semiconductor fin is formed over the photodiode and is electrically coupled thereto. A dielectric is formed laterally adjacent to sidewalls of the fin, and an ion implantation operation is performed to form a charge storage region in the semiconductor fin. A gate dielectric is formed over the charge storage region of the semiconductor fin, and a gate electrode is formed over the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) including one or more pixels, comprising:
    a photodiode arranged in a semiconductor substrate and including an n-type region near an upper surface of the substrate and a p-type region under the n-type region; and
    a semiconductor fin arranged over the photodiode and including a charge storage or charge transfer region in direct contact with an upper portion of the n-type region of the photodiode,
    wherein the charge storage or charge transfer region is adapted to store or transfer charge generated by the photodiode in response to impingent light.

2. The IC of claim 1, wherein the semiconductor fin includes a transfer transistor configured to selectively transfer charge stored on the charge storage region of the semiconductor fin to a floating diffusion (FD) region of a pixel.

3. The IC of claim 2, wherein the transfer transistor includes a transfer transistor gate electrode that straddles the semiconductor fin along a channel region, wherein the channel region has a first conductivity type and the charge storage region has a second conductivity type opposite the first conductivity type.

4. The IC of claim 3, further comprising:
    a reset transistor configured to selectively couple the FD region to a DC supply voltage, wherein the reset transistor is a MuGFET device.

5. The IC of claim 4, further comprising:
    a first dielectric layer, which has a first thickness, arranged over the substrate and separating the upper surface of the substrate from a lower surface of a gate electrode of the reset transistor;
    a second dielectric layer, which has a second thickness, arranged over the substrate and separating the upper surface of the substrate from a lower surface of the gate electrode of the transfer transistor;
    wherein the first thickness is greater than the second thickness.

6. The IC of claim 5, wherein the semiconductor fin is at least partially arranged in a recess in the first dielectric layer.

7. The IC of claim 1, wherein the semiconductor fin further comprises:
    first and second n-type source/drain regions, and a p-type channel region arranged over the n-type region of the photodiode and extending along a length of the semiconductor fin;
    a first conductive gate electrode arranged over the p-type channel region, wherein a first gate dielectric is arranged over the p-type channel region to separate the first conductive gate electrode from the p-type channel region; and a p-type anti-blooming region disposed vertically between the n-type region of the photodiode and the first source/drain region and separating the n-type region of the photodiode from the first source/drain region.

8. The IC of claim 7, further comprising:
a second conductive electrode arranged over the charge storage or charge transfer region and being distinct from the first conductive gate electrode, wherein a second gate dielectric is arranged over the charge storage or charge transfer region to separate the second conductive electrode from the charge storage or charge transfer region.

9. The IC of claim 7, further comprising:
a reset transistor having a conductive gate electrode arranged over the substrate;
wherein a lower surface of the first conductive gate electrode and a lower surface of the conductive gate electrode of the reset transistor have different heights as measured from the upper surface of the substrate.

10. An integrated circuit (IC) including one or more pixels, comprising:
a photodiode arranged in a semiconductor substrate and including an n-type region near an upper surface of the substrate and a p-type region under the n-type region; and
a semiconductor fin arranged over the photodiode and comprising a first source/drain region of a transfer transistor and a charge storage region separated by a channel region;
a reset transistor configured to selectively couple a floating diffusion (FD) region to a DC supply voltage;
a source-follower transistor; and
a row select line transistor;
wherein the reset transistor, source-follower transistor, and row select line transistor each have gate electrodes that straddle a single fin that extends in a continuous linear fashion between the FD region and an output node of the pixel.

11. An integrated circuit (IC) including a plurality of pixels arranged in a pixel array, wherein a pixel comprises:
a photodiode arranged in a substrate and including an n-type region near an upper surface of the substrate and a p-type region under the n-type region;
a transfer transistor corresponding to a semiconductor fin and having a source/drain region disposed directly on the n-type region of the photodiode, and configured to selectively transfer charge from the n-type region of the photodiode to a floating diffusion (FD) node, wherein a voltage level of the FD node controls a read-out circuit of the pixel; and
a charge storage region arranged in the semiconductor fin, wherein the charge storage region is adapted to store charge generated by the photodiode in response to impingent light.

12. The IC of claim 11, wherein the charge storage region is an n-type region extending along a length of the fin and being electrically coupled to the n-type region of the photodiode.

13. The IC of claim 11, wherein a p-type channel region is arranged in the semiconductor fin to separate the source/drain region coupled to the n-type region of the photodiode from a second source/drain region of the transfer transistor coupled to the FD node.

14. The IC of claim 13, wherein a gate electrode of the transfer transistor extends over the p-type channel region, and wherein a gate dielectric separates the gate electrode of the transfer transistor from the p-type channel region.

15. The IC of claim 11, further comprising:
a reset transistor to selectively couple the FD node to a DC supply voltage to set a predetermined reset voltage on the FD node prior to the transfer transistor transferring a stored charge from the photodiode to the FD node.

16. An integrated circuit (IC) including a plurality of pixels, comprising:
a photodiode arranged in a substrate and including an n-type region near an upper surface of the substrate and a p-type region under the n-type region; and
a semiconductor fin disposed above the substrate and comprising a first source/drain region of a transfer transistor and a charge transfer region separated by a channel region;
an isolation dielectric layer arranged over the substrate and separating the upper surface of the substrate from a lower surface of a gate electrode of a reset transistor;
wherein the charge transfer region is electrically coupled to the n-type region of the photodiode and configured to transfer charge from the n-type region of the photodiode to the transfer transistor.

17. The IC of claim 16, further comprising:
a second semiconductor fin overlying the n-type region of the photodiode and comprising the reset transistor spaced apart from the semiconductor fin, wherein a p-type region electrically isolates the photodiode from the reset transistor.

18. The IC of claim 16, wherein the charge transfer region has a length that is greater than a length of the first source/drain region of the transfer transistor.

19. The IC of claim 16, the semiconductor fin further comprising:
a p-type anti-blooming path arranged next to the charge transfer region between the n-type region of the photodiode and the first source/drain region, and configured to prevent or limit charge from drifting or diffusing into the charge transfer region.

20. The IC of claim 16, further comprising:
a gate dielectric layer and a gate electrode disposed on an upper surface of the channel region, and extending downwardly along an upper sidewall of the charge transfer region opposing to the first source/drain region of the transfer transistor to a location contacting an upper surface of the isolation dielectric layer.

* * * * *